US007788574B2

(12) United States Patent
Yoshida

(10) Patent No.: US 7,788,574 B2
(45) Date of Patent: Aug. 31, 2010

(54) ERROR CORRECTING PROCESSING DEVICE AND ERROR CORRECTING PROCESSING METHOD

(75) Inventor: Kenji Yoshida, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1009 days.

(21) Appl. No.: 11/523,031

(22) Filed: Sep. 19, 2006

(65) Prior Publication Data

US 2007/0124660 A1    May 31, 2007

(30) Foreign Application Priority Data

Nov. 17, 2005   (JP) .............................. 2005-332978

(51) Int. Cl.
*H03M 13/00* (2006.01)
(52) U.S. Cl. ...................... 714/800; 714/758
(58) Field of Classification Search ................. 714/758, 714/800
See application file for complete search history.

(56) References Cited

U.S. PATENT DOCUMENTS

| 5,289,501 | A | * | 2/1994 | Seshadri et al. ............. 375/286 |
| 5,388,105 | A | * | 2/1995 | Takagi et al. ................ 714/758 |
| 5,471,486 | A | * | 11/1995 | Baggen et al. ............... 714/782 |
| 5,771,248 | A |  | 6/1998 | Katayama et al. |
| 5,872,798 | A | * | 2/1999 | Baggen et al. ............... 714/755 |
| 6,079,041 | A | * | 6/2000 | Kunisa et al. ................ 714/752 |
| 6,141,787 | A | * | 10/2000 | Kunisa et al. ................ 714/769 |
| 6,144,324 | A | * | 11/2000 | Sasaki .......................... 341/94 |
| 6,163,514 | A | * | 12/2000 | Narumi et al. ............. 369/47.15 |
| 6,199,190 | B1 | * | 3/2001 | Wan ............................ 714/786 |
| 6,445,313 | B2 | * | 9/2002 | Ahn ............................ 341/59 |
| 6,631,490 | B2 |  | 10/2003 | Shimoda |
| 7,414,955 | B2 | * | 8/2008 | Iwanaga .................. 369/275.3 |
| 2003/0031102 | A1 | * | 2/2003 | Narumi et al. ............. 369/47.3 |

FOREIGN PATENT DOCUMENTS

| JP | 9-274591 | 10/1997 |
| JP | 2000-57709 | 2/2000 |

OTHER PUBLICATIONS

Fan, et al., "A Modified Concatenated Coding Scheme, with Applications to magnetic Data Storage", IEEE Transactions on Information Theory, vol. 44, No. 4, (Jul. 1998).
Notice of Reasons for Rejection, mailed Jun. 1, 2010, in corresponding Japanese Patent Application No. 2005-332978 and English-language translation thereof.

* cited by examiner

*Primary Examiner*—M. Mujtaba K Chaudry
(74) *Attorney, Agent, or Firm*—Finnegan, Henderson, Farabow, Garrett & Dunner, L.L.P.

(57) ABSTRACT

According to one embodiment, modulation processing to convert digital information sequences into a form that meets a request from a recording/reproducing system is performed on a digital information sequence and a dummy bit is added to the sequence, and furthermore, an error correcting parity bit sequence is added to the digital information sequence. If the added parity bit sequence does not correspond to a form that meets a request from the recording/reproducing system, a value of the dummy bit is changed and the parity bit sequence is replaced with a parity bit sequence that corresponds to the dummy bit of the changed value.

13 Claims, 5 Drawing Sheets

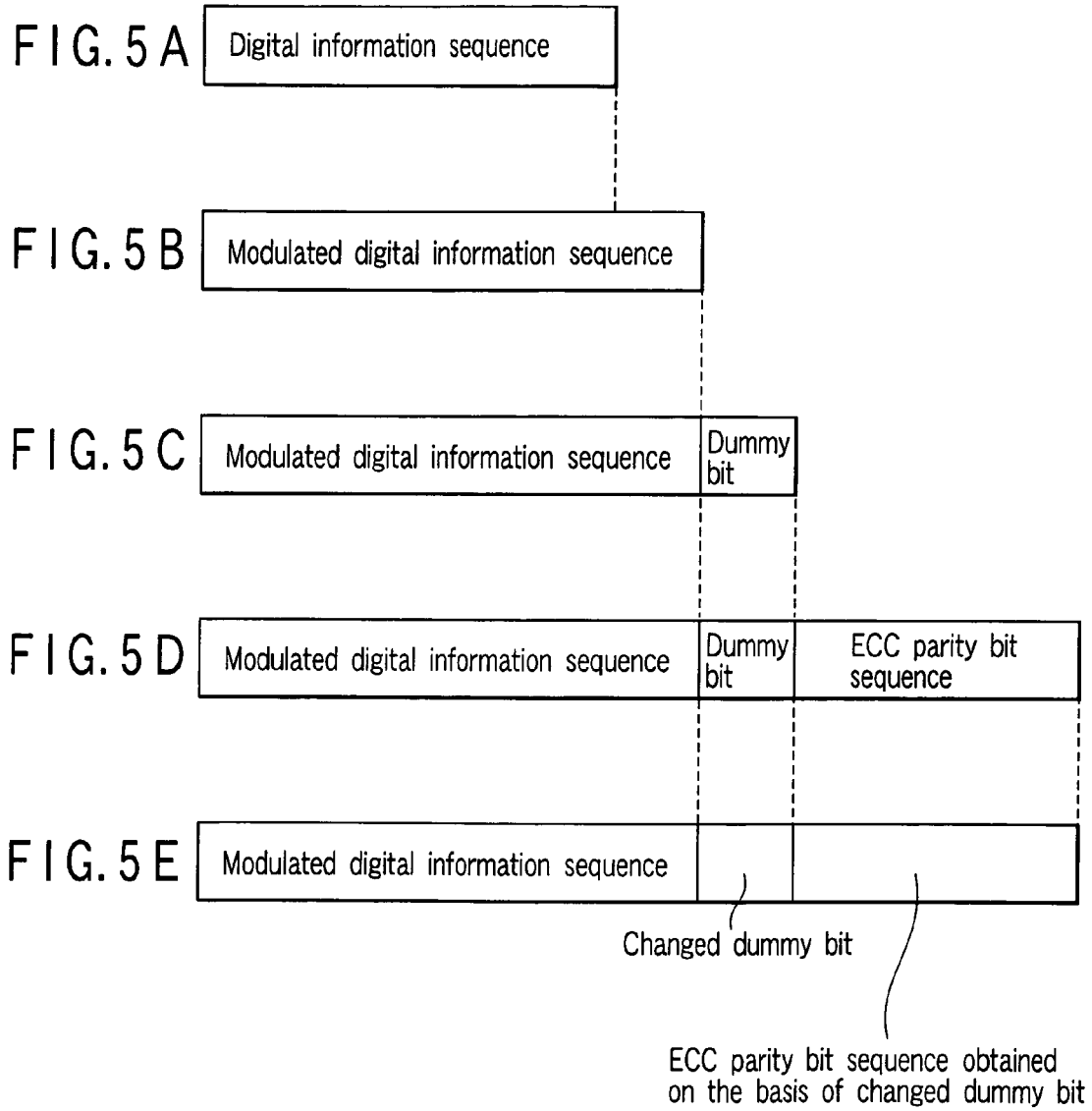

ERROR CORRECTING PROCESSING DEVICE AND ERROR CORRECTING PROCESSING METHOD

CROSS-REFERENCE TO RELATED APPLICATIONS

This application is based upon and claims the benefit of priority from Japanese Patent Application No. 2005-332978, filed Nov. 17, 2005, the entire contents of which are incorporated herein by reference.

BACKGROUND

1. Field

One embodiment of the invention relates to improvements in a device and method for error correcting encoding processing on a digital information sequence.

2. Description of the Related Art

As is well known, in a system for recording a digital information sequence that corresponds to video, audio and the like on an information recording medium such as a disk and a tape and reproducing such a sequence from such a medium, an ECC (error correcting code) parity is added to a digital information sequence to be recorded. And then a modulation processing, such as to limit the number of sequential zeros within a predetermined number, to meet a request from recording/reproducing system is performed.

In contrast, as disclosed in a document (IEEE TRANSACTION ON INFORMATION THEORY, VOL. 44, NO. 4, JULY 1998), recently encoding means (which is referred to as reverse ECC in some cases) has been developed which adds an ECC parity to a digital information sequence to be recorded by performing first modulation processing to meet a request from a recording/reproducing system and then performs second modulation processing to meet a request from the recording/reproducing system on the added ECC parity.

However, the encoding means described in the document needs to perform modulation processing twice, that is, the first modulation processing performed on an original digital information sequence and the second modulation processing performed on an ECC parity of the sequence, so that the encoding means has a complicated configuration and a number of bits of data to be recorded gets big.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIGS. 5A to 5E are explanatory diagrams of processing operations of the modulation circuit used in the optical disk unit according to the same embodiment.

DETAILED DESCRIPTION

Various embodiments according to the invention will be described hereinafter with reference to the accompanying drawings. In general, according to one embodiment of the invention, modulation processing to convert digital information sequences into a form that meets a request from a recording/reproducing system is performed on a digital information sequence and a dummy bit is added to the sequence, and furthermore, an error correcting parity bit sequence is added to the digital information sequence. If the added parity bit sequence does not correspond to a form that meets a request from the recording/reproducing system, a value of the dummy bit is changed and the parity bit sequence is replaced with a parity bit sequence that corresponds to the dummy bit of the changed value.

Figure 1:
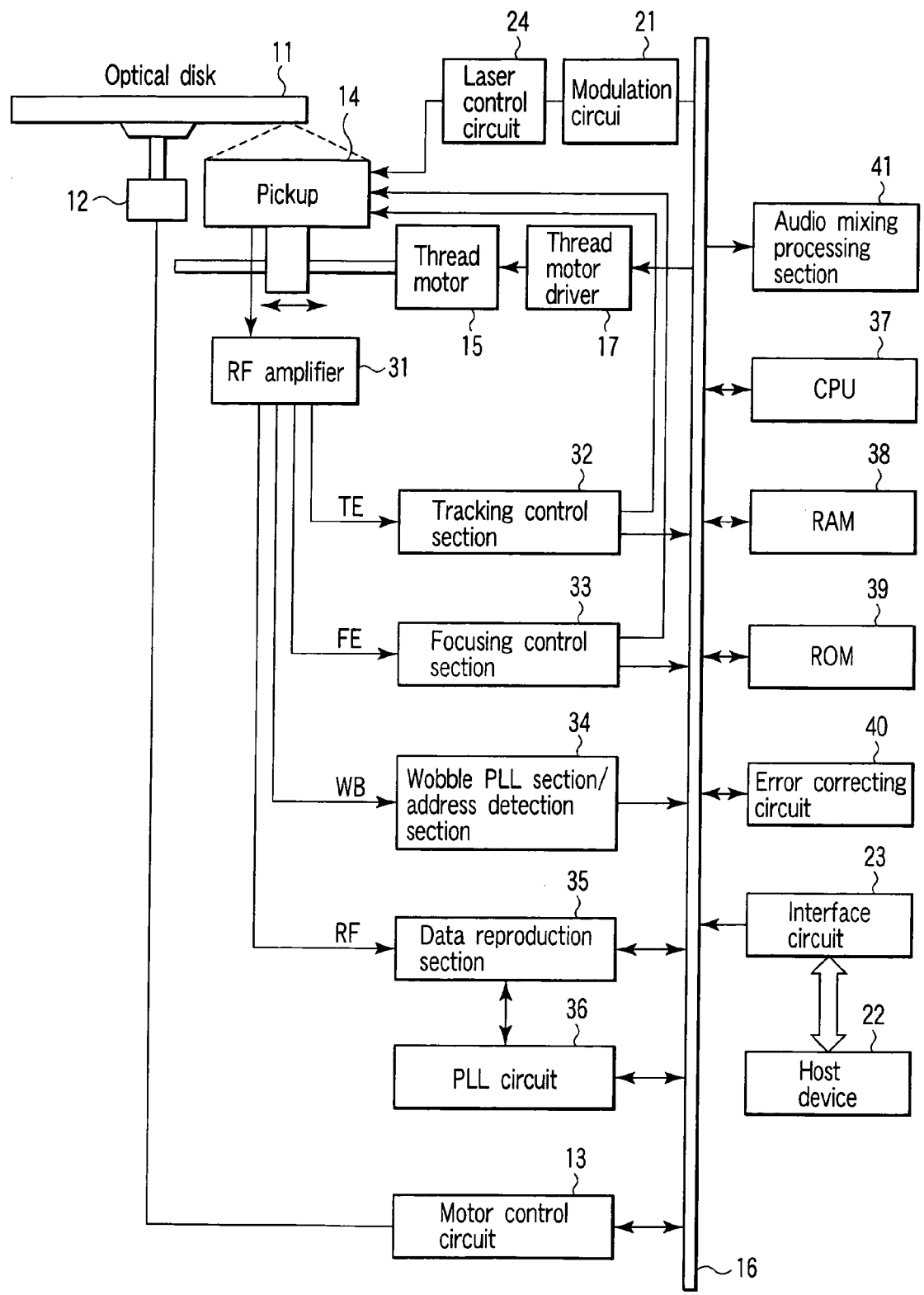
FIG. 1 is an explanatory block diagram of an optical disk unit according to one embodiment of the present invention.
Figure 2:
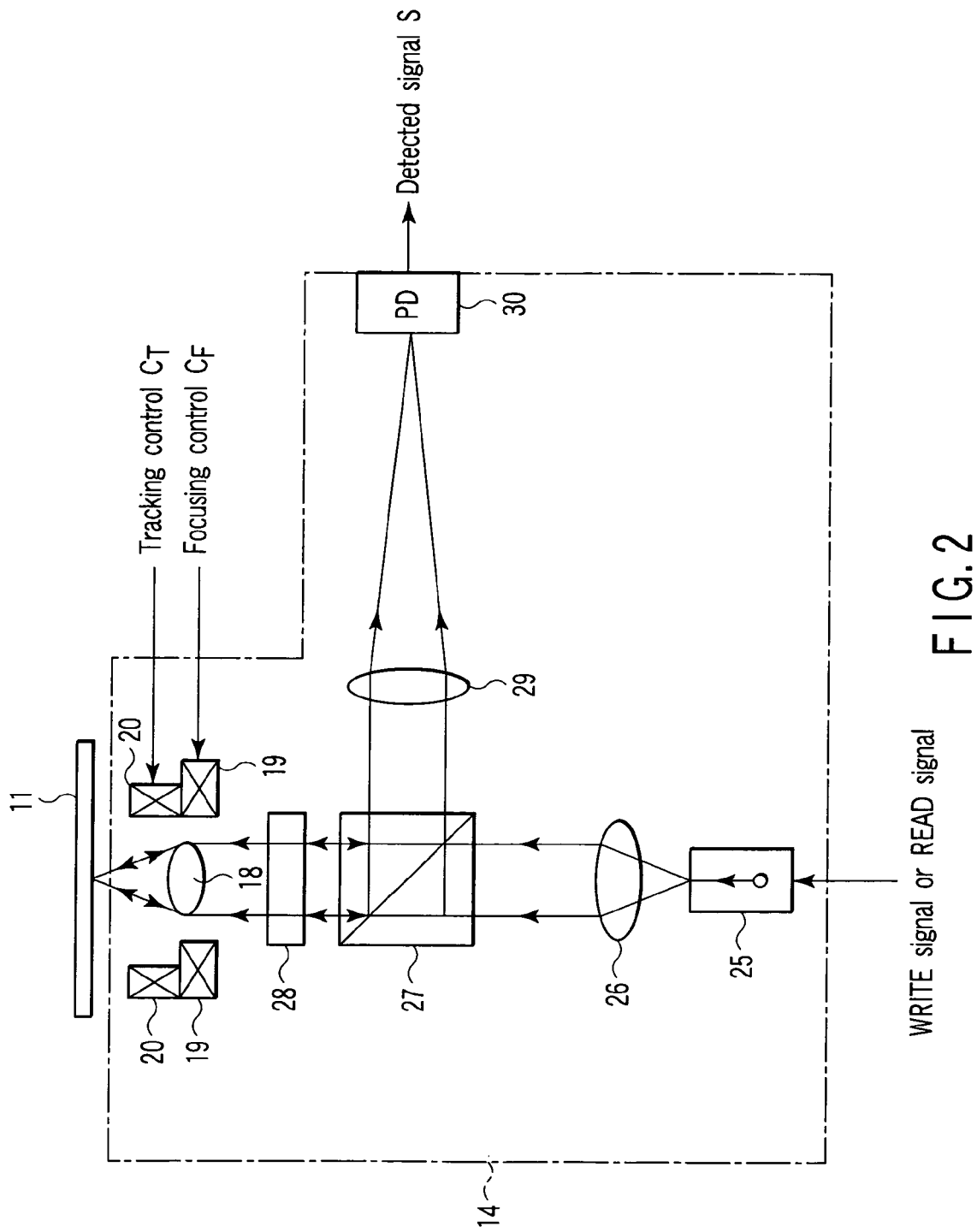
FIG. 2 is an explanatory diagram of a configuration of a pickup used in the optical disk unit of the same embodiment.

An optical disk unit related to the present embodiment has such a configuration as shown in FIGS. 1 and 2. Here, an optical disk 11 may be a recordable (or rewritable) user data or a read only optical disk; in the present embodiment, it is described as an optical disk including a next generation DVD (digital versatile disk) recordable (or rewritable).

The optical disk 11 may be a next generation DVD-RAM (random access memory), DVD-RW (rewritable), DVD-R (recordable), etc. using blue color-based laser light having a wavelength of about 405 nm, a present generation DVD-RAM, DVD-RW, DVD-R, etc. using red color-based laser light having a wavelength of about 650 nm or the like.

In a surface of the optical disk 11, a land track and a groove track are formed spirally. The optical disk 11 is rotary-driven by a spindle motor 12. A rotational speed of the spindle motor 12 is controlled by a motor control circuit 13.

Information is recorded on the optical disk 11 and reproduced from it by a pickup 14. The pickup 14 is coupled to a thread motor 15 via a gear. The thread motor 15 is controlled by a thread motor driver 17 connected to a data bus 16. A fixed section of the thread motor 15 is provided with a permanent magnet, not shown, so that by exciting a drive coil (not shown), the pickup 14 moves in a radius direction of the optical disk 11.

The pickup 14 is equipped with an objective lens 18 as shown in FIG. 2. The objective lens 18 can move in a focusing direction (direction of an optical axis of the lens) when driven by a drive coil 19 and move in a tracking direction (direction orthogonal to the optical axis of the lens) when driven by a drive coil 20, so that by moving a beam spot of laser light, track jump can be performed.

A modulation circuit 21, whose details are described later, adds an ECC parity on a user data supplied from a host device 22 via an interface circuit 23 at the time of recording an information by performing a compressive modulation processing (modulation processing that limits the number of sequential zeros within a predetermined length, for example) being in a form that meets a request from a recording/reproducing system in the optical disk unit such as run-length encoding processing, for example. A laser control circuit 24 provides a WRITE signal to a semiconductor laser diode 25 based on encoded data supplied from the modulation circuit 21 at the time of information recording.

Further, the laser control circuit 24 provides the semiconductor laser diode 25 with a READ signal smaller in amplitude than the WRITE signal when reading information.

The semiconductor laser diode 25 emits laser light in response to the WRITE signal supplied from the laser control circuit 24. The laser light emitted from the semiconductor laser diode 25 passes through a collimator lens 26, a half prism 27, an optical system 28, and the objective lens 28, to be irradiated to the optical disk 11. Reflected light from the optical disk 11 passes through the objective lens 18, the optical system 28, the half prism 27, and a condenser lens 29 and is guided to a light-detector 30.

The light-detector 30 consist of a four fraction light-detection cell, which supply signals A, B, C, and D to an RF (radio frequency) amplifier 31. The RF amplifier 31 supplies a tracking control section 32 with a tracking error signal TE that corresponds to (A+D)−(B+C) by employing, for example, a push-pull method and also supplies a focusing control section 33 with a focus error signal FE that corresponds to (A+C)−(B+D) by employing, for example, an astigmatism method.

Furthermore, the RF amplifier 31 supplies a wobble PLL section/address detection section 34 with a WOBBLE signal WB that corresponds to, for example, the above-described (A+D)−(B+C) and supplies a data reproduction section 35 with an RF signal that corresponds to (A+D)+(B+C).

On the other hand, an output signal of the focusing control section 33 is supplied to the drive coil 19 in a focusing direction. This causes control to be conducted so that the laser light is always just focused on a recording film of the optical disk 11. Further, the tracking control section 32 generates a track drive signal in response to the tracking error signal TE and supplies it to the drive coil 20 in a tracking direction.

By conducting such focusing control and tracking control, a change in coefficient of reflection from a pit etc. formed on a track of the optical disk 11 in accordance with record information is reflected on the sum signal RF of the output signals from the light-detection cells of the light-detector 30. The signal is supplied to the data reproduction section 35.

The data reproduction section 35 reproduces recorded data based on a reproduction clock signal from a PLL circuit 36. Further, the data reproduction section 35 has a function to measure an amplitude of the signal RF, the measured value is read by a CPU (central processing unit) 37.

When the objective lens 18 is under the control of the above-described tracking control section 32, the pickup 14 is controlled by controlling the thread motor 15 so that the objective lens 18 is at an optical position on the optical disk 11.

The motor control circuit 13, the laser control circuit 24, the focusing control section 33, the tracking control section 32, the data reproduction section 35, the PLL circuit 36, etc. can be incorporated into one LSI (large scale integration circuit) as a servo control circuit.

Further, these circuit sections are controlled by the CPU 37 via the bus 16. The CPU 37 comprehensively controls the optical disk unit based on an operation command provided by the host device 22 via the interface circuit 23 or operation information from an operation section (not shown).

Furthermore, the CPU 37 uses a RAM 38 as a work area, to perform a predetermined operation in accordance with a program recorded in a ROM (read only memory) 39.

Then, data reproduced by the above-described data reproduction section 35 undergoes error correcting processing by an error correcting processing circuit 40 and then is supplied to be reproduced into video, sub-video, audio, etc.

In this case, a plurality of digital audio data pieces after error correcting processing is supplied to a audio mixing processing section 41 to be mixed so that these data pieces can be output to an outside of the optical disk unit.

Figure 3:
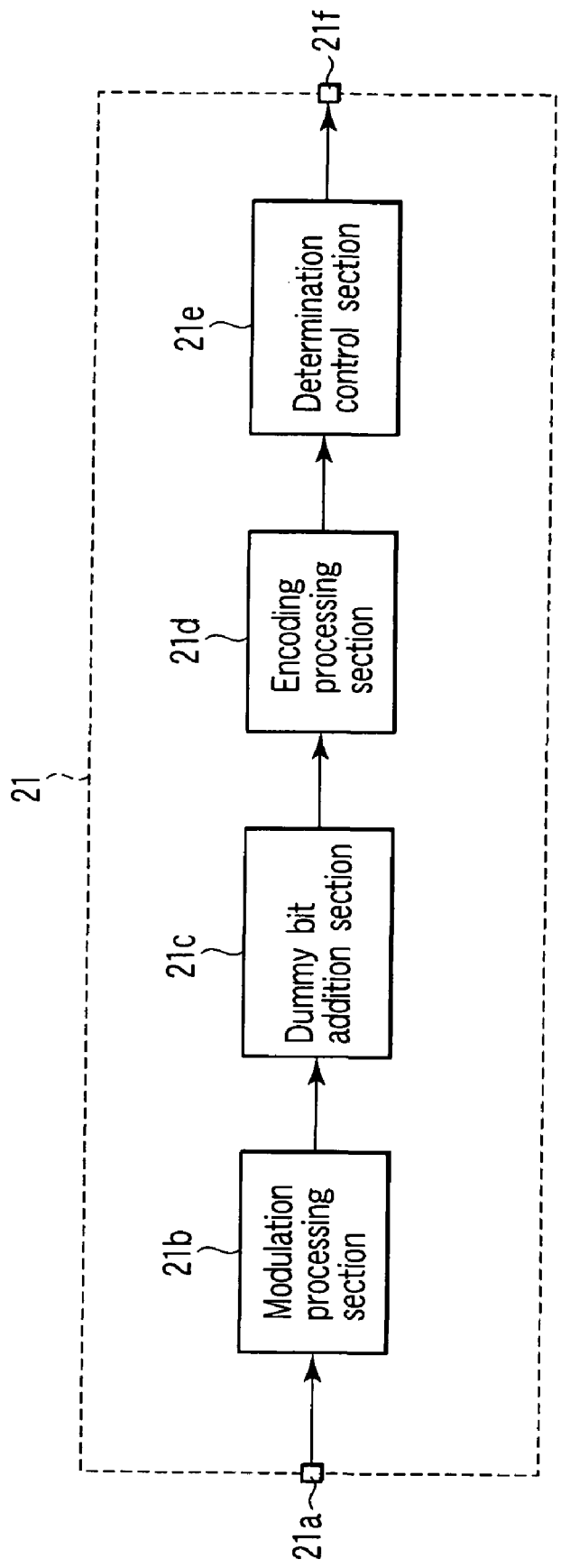
FIG. 3 is an explanatory block diagram of a modulation circuit used in the optical disk unit according to the same embodiment.

FIG. 3 shows details of the above-described modulation circuit 21. That is, user data, which is supplied from the host device 22 via the interface circuit 23 at the time of recording of information, is supplied from an input terminal 21a to a modulation processing section 21b.

The modulation processing section 21b performs on an input digital information sequence a compressive modulation processing, for example, modulation processing that limits the number of sequential zeros within a predetermined length, being in a form that meets a request from the recording/reproducing system in the optical disk unit such as run-length encoding processing, for example.

Then, the digital information sequence after modulation processing by the modulation processing section 21b is supplied to a dummy bit addition section 21c. The dummy bit addition section 21c adds a dummy bit to the input digital information sequence so that the sequence may match a number of bits that can be input to an encoding processing section 21d on the downstream side.

The dummy bit addition processing may be performed either before or after modulation processing by the modulation processing section 21b. However, to be performed before that, a position of the dummy bit in a digital information sequence, which is input to the encoding processing section 21d, needs to be known beforehand.

Then, the digital information sequence, to which the dummy bit is added by the dummy bit addition section 21c, is supplied to the encoding processing section 21d. The encoding processing section 21d computes an ECC parity based on, for example, a reed solomon code and adds it to the input digital information sequence.

Then, the digital information sequence to which an ECC parity bit sequence is added by the encoding processing section 21d is supplied to a determination control section 21e. The determination control section 21e determines whether the ECC parity bit sequence included in the input digital information sequence is in a form that meets a request from the recording/reproducing system in the optical disk unit, for example, such a form that the number of sequential zeros is limited within a predetermined length.

Then, if the determination control section 21e determines that the ECC parity bit sequence is in a form that meets a request from the recording/reproducing system in the optical disk unit, the determination control section 21e outputs the digital information sequence, to which the ECC parity bit supplied by the encoding processing section 21d is added from an output terminal 21f, as is so that it is supplied to the laser control circuit 24.

Further, if the determination control section 21e determines that the ECC parity bit sequence is not in a form that meets a request from the recording/reproducing system in the optical disk unit, the determination control section 21e changes a value of the dummy bit and newly calculates ECC parity based on that dummy bit of changed value.

Then, the determination control section 21e adds the changed dummy bit and the ECC parity bit sequence newly obtained on the basis of the dummy bit to a modulated digital information sequence and outputs it from the output terminal 21f so that it may be supplied to the laser control circuit 24.

In this case, a probability, that an ECC parity bit sequence calculated first by the encoding processing section 21d is not in a form that meets a request from the recording/reproduction system in the optical disk unit, is practically very small.

Therefore, if the ECC parity bit sequence calculated first by the determination control section 21e is not in a form that meets a request from the recoding/reproduction system in the optical disk unit, an ECC parity bit sequence newly calculated by changing the value of the dummy bit also has an extremely small possibility of not being in a form that meets a request from the recording/reproducing system in the optical disk unit. That is, using a newly calculated ECC parity bit sequence causes no problem actually.

Figure 4:
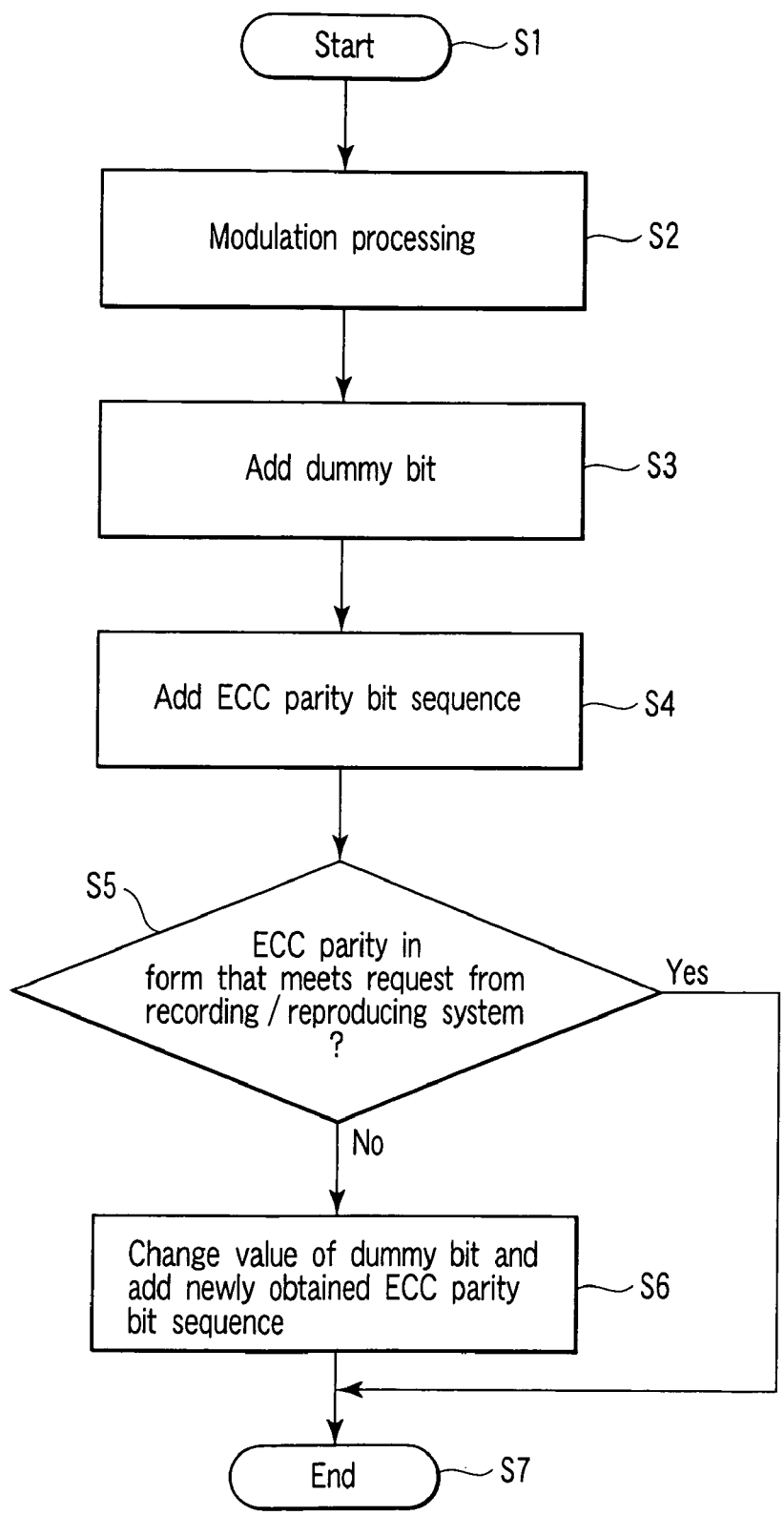
FIG. 4 is an explanatory flowchart of processing operations of the modulation circuit used in the optical disk unit according to the same embodiment.

FIG. 4 shows a flowchart that summarizes processing operations of the above-described modulation circuit 21. The processing operations start when a digital information sequence, which is user data such as shown in FIG. 5A, is supplied to the modulation processing section 21b (block S1).

Then, in block S2, the modulation processing section 21b performs on the input digital information sequence such modulation processing, such as to limit the number of sequential zeros within a predetermined number, to make it in a form that meets a request from the recording/reproducing system in the optical disk unit as shown in FIG. 5B. In this case, a length of the data after the modulation processing is larger than a data length before the modulation.

Then, in block S3, the dummy bit addition section 21c adds a dummy bit to the modulated digital information sequence so that it may match a number of bits that can be input to the encoding processing section 21d on the downstream side as shown in FIG. 5C.

Then, in block S4, the encoding processing section 21d calculates an ECC parity based on, for example, a reed solomon code as shown in FIG. 5D and adds the resultant ECC parity bit sequence to the modulated digital information sequence, to which the dummy bit has been added.

Then, in block S5, the determination control section 21e determines whether the added ECC parity bit sequence is in a form that meets a request from the recording/reproducing system in the optical disk unit, for example, such a form that the number of sequential zeros are limited within a predetermined length.

If the determination control section 21e determines that the ECC parity bit sequence is in a form that meets a request from the recording/reproducing system in the optical disk unit (YES), the determination control section 21e outputs the digital information sequence, to which the ECC parity bit supplied from the encoding processing section 21d is added, from the output terminal 21f as is, thus the processing ends (block S7).

On the other hand, if the control section 21e determines that the ECC parity bit sequence is not in a form that meets a request from the recording/reproducing system in the optical disk unit (NO), the determination control section 21e newly calculates ECC parity by changing the value of the dummy bit in block S6, adds the changed dummy bit and an ECC parity bit sequence newly obtained on the basis of the dummy bit to the modulated digital information sequence as shown in FIG. 5E, and outputs it from the output terminal 21f, thus the processing ends (block S7).

According to this embodiment, if an ECC parity bit sequence generated on the basis of a predetermined dummy bit value is not in a form that meets a request from the recording/reproduction system in the optical disk unit, the sequence is replaced with an ECC party bit sequence newly generated by changing the dummy bit value.

Therefore not like the conventional situation, it is unnecessary to perform second modulation processing required to convert an added ECC parity bit sequence into such a form that meets a request from the recording/reproducing system in the optical disk unit, thereby enabling simplifying a configuration. Further, an ECC parity sequence is not subject to modulation processing, so that a length of data to be recorded can be shortened.

In this case, if a value of a dummy bit is changed, an ECC party bit sequence that corresponds to the changed dummy bit can be obtained by supplying the changed dummy bit to the encoding processing section 21d.

The ECC party bit sequence that corresponds to the changed dummy bit can be obtained in another way, such as performing logical operations on an ECC parity bit sequence, before a dummy bit is changed, and a pattern generated beforehand. For example, it can be easily obtained by computing an exclusive logical sum of an ECC parity bit sequence before a dummy bit is changed and an ECC parity bit sequence, at the time when values of bits of the modulated digital information sequence are all "0" and the value of the dummy bit is "1".

Specifically, if an ECC parity bit sequence at the time when the number of dummy bits is one and its value is "0" is not in a form that meets a request from the recording/reproducing system in the optical disk unit, an ECC parity bit sequence at the time when the dummy bit value is changed, that is, when the dummy bit value is set to "1" can be obtained by computing an exclusive logical sum of an ECC parity bit sequence at the time when the dummy bit value is "0" and an ECC parity bit, at the time when the values of the bits of the modulated digital information sequence are all "0" and the dummy bit value is "1".

On the other hand, if an ECC parity bit sequence at the time when the value of the dummy bit is "1" is not in a form that meets a request from the recording/reproducing system in the optical disk unit, an ECC parity bit sequence at the time when the dummy bit value is set to "0" can be obtained by computing an exclusive logical sum of an ECC parity bit sequence at the time when the dummy bit value is "1" and an ECC parity bit, at a time when the values of the bits of the modulated digital information sequence are all "0" and the dummy bit value is "1".

Even in a case where the number of dummy bits is two or more, an ECC party bit sequence that corresponds to that changed dummy bits can be obtained by performing operations similar to those described above when a value of dummy bits are changed.

It is also possible to generate an ECC parity bit sequence beforehand for each of some or all of possible values of dummy bits according to the number of the dummy bits and replace the ECC parity bit with the ECC parity bit sequence that corresponds to the dummy bits of any other value if the ECC parity bit sequence, that corresponds to the dummy bits of the value set first set, is not in a form that meets a request from the recording/reproducing system.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An error correcting processing device comprising:
   a processing section configured to perform on a digital information sequence modulation processing to convert the sequence into a form that meets a request from a recording/reproducing system and processing to add a dummy bit to the sequence;
   an encoding section configured to add an error correcting parity bit sequence to the digital information sequence output from the processing section; and
   a control section configured to change a value of the dummy bit and to replace the parity bit sequence with a parity bit sequence that corresponds to the dummy bit of changed value if the parity bit sequence added by the encoding section does not correspond to a form that meets a request from the recording/reproducing system.

2. An error correcting processing device according to claim 1, wherein
the control section is configured to supply the dummy bit of the changed value to the encoding section, and to obtain a parity bit sequence that corresponds to the dummy bit of the changed value.

3. An error correcting processing device according to claim 1, wherein
the control section is configured to obtain a parity bit sequence that corresponds to the dummy bit of the changed value by logical operation on an ECC parity bit sequence, before the dummy bit is changed, and a pattern generated beforehand.

4. An error correcting processing device according to claim 1, wherein
the control section is configured to obtain a parity bit sequence that corresponds to the dummy bit of the changed value by computing an exclusive logical sum of a parity bit sequence before the dummy bit value is changed and a parity bit sequence, at the time when values of bits of the digital information sequence modulated by the processing section are all "0" and the dummy bit value is "1".

5. An error correcting processing device according to claim 1, wherein
the control section generates a parity bit sequence that corresponds to each of some or all of possible values of the dummy bits and to replace the sequence with a parity bit sequence generated in accordance with the dummy bits of any other value if the parity bit sequence added by the encoding section does not correspond to a form that meets a request from the recording/reproducing system.

6. An error correcting processing device according to claim 1, wherein
the control section is configured to determine whether the parity bit sequence added by the encoding section corresponds to a form that meets a request from the recording/reproducing system, to change the value of the dummy bit and replace the sequence with a parity bit sequence that corresponds to the dummy bit of the changed value if it does not correspond, and to output the parity bit sequence added by the encoding section as is if it corresponds.

7. A recording/reproducing device comprising:
an input section configured to have a digital information sequence input thereto;
a processing section configured to perform on the digital information sequence, input to the input section, modulation processing to convert the sequence into a form that meets a request from a recording/reproducing system and processing to add a dummy bit to the sequence;
an encoding section configured to add an error correcting parity bit sequence to the digital information sequence output from the processing section;
a control section configured to change a value of the dummy bit and to replace the parity bit sequence with a parity bit sequence that corresponds to the dummy bit of the changed value, if the parity bit sequence added by the encoding section does not correspond to a form that meets a request from the recording/reproducing system; and
a recording/reproducing section configured to record an output of the control section on an information recording medium and to reproduce the output from the medium.

8. An error correcting processing method comprising:
a first block of performing on a digital information sequence modulation processing to convert the sequence into a form that meets a request from a recording/reproducing system and processing to add a dummy bit to the sequence;
a second block of adding an error correcting parity bit sequence to the digital information sequence output in the first block; and
a third block of changing a value of the dummy bit and replacing the parity bit sequence with a parity bit sequence that corresponds to the dummy bit of the changed value if the parity bit sequence added in the second block does not correspond to a form that meets a request from the recording/reproducing system.

9. An error correcting processing method according to claim 8, wherein
the third block uses the second block to obtain a parity bit sequence that corresponds to the dummy bit of the changed value.

10. An error correcting processing method according to claim 8, wherein
in the third block, a parity bit sequence that corresponds to the dummy bit of the changed value is obtained by logical operation on an ECC parity bit sequence, before the dummy bit is changed, and a pattern generated beforehand.

11. An error correcting processing method according to claim 8, wherein
in the third block, a parity bit sequence that corresponds to the dummy bit of the changed value is obtained by computing an exclusive logical sum of a parity bit sequence before the dummy bit value is changed and a parity bit sequence, at the time when values of bits of the digital information sequence modulated in the first block are all "0" and the dummy bit value is "1".

12. An error correcting processing method according to claim 8, wherein
in the third block, a parity bit sequence that corresponds to each of some or all of possible values of the dummy bits is generated and the sequence is replaced with a parity bit sequence generated in accordance with the dummy bits of any other value if the parity bit sequence added in the second block does not correspond to a form that meets a request from the recording/reproducing system.

13. An error correcting processing method according to claim 8, wherein
in the third block, whether the parity bit sequence added in the second block corresponds to a form that meets a request from the recording/reproducing system is determined, the value of the dummy bit is changed, and the sequence is replaced with a parity bit sequence that corresponds to the dummy bit of the changed value if it does not correspond, and the parity bit sequence added in the second block is output as is if it corresponds.

* * * * *